(12) United States Patent
Sivero et al.

(10) Patent No.: US 7,417,904 B2
(45) Date of Patent: Aug. 26, 2008

(54) ADAPTIVE GATE VOLTAGE REGULATION

(75) Inventors: Stefano Sivero, Capriate (IT); Stefano Surico, Milan (IT); Fabio Tassan Caser, Arcore (IT); Mauro Chinosi, Burago Di Molgora (IT)

(73) Assignee: ATMEL Corporation, San Jose, CA (US)

( * ) Notice: Subject to any disclaimer, the term of this patent is extended or adjusted under 35 U.S.C. 154(b) by 56 days.

(21) Appl. No.: 11/554,797

(22) Filed: Oct. 31, 2006

(65) Prior Publication Data

US 2008/0101133 A1   May 1, 2008

(51) Int. Cl.
*G11C 5/14* (2006.01)
(52) U.S. Cl. .................. 365/189.09; 365/189.07; 365/185.17; 365/185.18
(58) Field of Classification Search ............. 365/189.09, 365/189.07, 185.17, 185.18
See application file for complete search history.

(56) References Cited

U.S. PATENT DOCUMENTS

| | | | |
|---|---|---|---|
| 5,122,792 A | 6/1992 | Stewart | |
| 5,198,995 A | 3/1993 | Dennard et al. | |
| 5,220,528 A | 6/1993 | Mielke | |
| 5,495,186 A | 2/1996 | Kanazawa et al. | |
| 5,546,341 A | 8/1996 | Suh et al. | |
| 5,614,871 A | 3/1997 | Miyabe | |
| 5,856,945 A | 1/1999 | Lee et al. | |
| 6,621,758 B2 | 9/2003 | Cheung et al. | |
| 6,734,742 B2 | 5/2004 | Muroor | |
| 6,819,620 B2 * | 11/2004 | Lin et al. | 365/227 |
| 6,878,991 B1 | 4/2005 | Forbes | |
| 6,944,068 B2 | 9/2005 | Quader et al. | |
| 6,946,882 B2 | 9/2005 | Gogl et al. | |
| 6,975,542 B2 | 12/2005 | Roohparvar | |
| 7,006,379 B2 * | 2/2006 | Noguchi et al. | 365/185.17 |
| 7,075,146 B2 | 7/2006 | Forbes | |
| 7,093,062 B2 | 8/2006 | Cioaca | |
| 7,095,658 B2 | 8/2006 | Cioaca | |
| 7,298,650 B2 * | 11/2007 | Khouri et al. | 365/185.12 |
| 2002/0003722 A1 | 1/2002 | Kanda et al. | |
| 2002/0109535 A1 | 8/2002 | Caliboso | |
| 2002/0176291 A1 | 11/2002 | Cheung et al. | |
| 2003/0048662 A1 | 3/2003 | Park et al. | |
| 2003/0051093 A1 | 3/2003 | Takeuchi | |
| 2004/0120200 A1 | 6/2004 | Gogl | |
| 2004/0202028 A1 | 10/2004 | Cioaca | |
| 2005/0005055 A1 | 1/2005 | Pasotti et al. | |
| 2005/0088890 A1 | 4/2005 | Matsunaga | |
| 2005/0167743 A1 | 8/2005 | Forbes | |
| 2005/0174852 A1 | 8/2005 | Hemink | |

(Continued)

FOREIGN PATENT DOCUMENTS

EP          536326  B1   6/1990

(Continued)

*Primary Examiner*—Tuan T Nguyen
(74) *Attorney, Agent, or Firm*—Fish & Richardson P.C.

(57) ABSTRACT

A memory device generates a select voltage and an unselect voltage on bit lines and generates a bit line select voltage having a magnitude less than the unselect voltage so that the application of the bit line select voltage to a gate of a transistor receiving the select voltage causes the transistor to conduct, and the application of the bit line select voltage to a gate of a transistor receiving the unselect voltage biases the transistor off.

23 Claims, 3 Drawing Sheets

U.S. PATENT DOCUMENTS

| | | |
|---|---|---|
| 2005/0180186 A1 | 8/2005 | Lutze et al. |
| 2005/0184337 A1 | 8/2005 | Forbes |
| 2005/0226055 A1 | 10/2005 | Guterman |
| 2005/0254309 A1 | 11/2005 | Kwon et al. |
| 2005/0265063 A1 | 12/2005 | Forbes |
| 2006/0002190 A1 | 1/2006 | Roohparvar |
| 2006/0018183 A1 | 1/2006 | De Sandre et al. |
| 2006/0039197 A1 | 2/2006 | Khouri |
| 2006/0044872 A1 | 3/2006 | Nazarian |
| 2006/0092718 A1 | 5/2006 | Cioaca |
| 2006/0098522 A1 | 5/2006 | Cioaca |
| 2006/0187712 A1 | 8/2006 | Roohparvar |
| 2006/0187716 A1 | 8/2006 | Roohparvar |

FOREIGN PATENT DOCUMENTS

| | | |
|---|---|---|
| EP | 436073 A3 | 7/1991 |
| EP | 1087529 A3 | 9/2000 |
| EP | 1087529 B1 | 3/2001 |
| EP | 1526547 A1 | 4/2005 |
| EP | 1573740 B1 | 9/2005 |
| EP | 1598831 A1 | 11/2005 |
| WO | WO91/20074 A1 | 12/1991 |
| WO | WO2004/057619 A1 | 7/2004 |
| WO | WO2004-061861 A2 | 7/2004 |
| WO | WO 05/081318 | 9/2005 |
| WO | WO 05/083782 | 9/2005 |
| WO | WO2005/104135 A1 | 11/2005 |

\* cited by examiner

ADAPTIVE GATE VOLTAGE REGULATION

BACKGROUND

This disclosure relates to generating control signals for memory devices.

A memory device, such as a flash memory, can comprise a series of bit lines arranged in columns. Each bit line, in turn, is connected to a series of memory strings, and each memory string includes several memory locations, e.g., M1 . . . Mn, that correspond to bit locations. Each memory string has one end coupled to a corresponding bit line by a bit line selector, and another end coupled to a ground selector. Typically the bit line selector and the ground selector comprise transistors.

The columnar architecture of the bit lines and memory strings results in numerous parallel memory locations. Each memory location has in input terminal, e.g., a gate, and the memory locations are grouped in a row-like fashion by connecting the respective gates of the memory locations to a corresponding word lines.

To program a selected memory location in the flash memory, a memory string that includes the selected memory location is selected by coupling the memory string to a reference voltage, e.g., a ground voltage applied to the bit line, and the input to the memory location is coupled to a program voltage applied to the word line for a period of time sufficient to program the selected memory location. Another voltage of a lesser magnitude, e.g., a pass voltage, is applied to the word lines of memory locations in the memory string that are not to be programmed. Because the memory locations are grouped by rows defined by the word line, however, memory locations in parallel memory strings will also receive the program voltage and pass voltage. To prevent programming in the parallel strings, the corresponding bit line selectors and ground selectors are kept off. The resulting high impedance of the bit line selectors and the ground selectors allows the unselected memory strings to float in response the capacitive coupling of the world line voltages. The technique known as "channel boosting," prevents the memory locations in the unselected string from being programmed.

To ensure that a memory string that shares the word line of the selected locations (e.g., a memory string on the same row as the selected memory string) is unselected, an unselect voltage, e.g., a supply voltage $V_{dd}$, is applied to the bit line to which that memory string is connected. The selected memory string, on the other hand, has a select voltage, e.g., a ground voltage. applied to a corresponding bit line. The memory strings defining other rows can have word line voltage at a reference value, e.g., ground or 0 volts, and can also have the gates of the bit line selectors at the reference value to ensure that the corresponding memory strings are unselected. On the other end, because the input of the bit line selector, e.g., a gate, on the row of the selected location also has the supply voltage applied, no forward bias is present in the bit line selector and the bit line selector is kept off. However, if the unselect voltage on the bit line is low, the bit line selector may be slightly forward biased and conduct. Such conduction can reduce the channel booting effect and cause inadvertent programming of other memory cells.

SUMMARY

Disclosed herein are adaptive gate voltage regulation systems and methods. The systems and methods can, for example, be implemented in a memory device. In one implementation, the memory device includes a plurality of bit lines and a plurality of column selectors connected to the bit lines. The column selectors are configured to receive a first voltage or a second voltage and output a select voltage or an unselect voltage to the bit lines. The memory device also includes a plurality of bit line selector transistors connected to the bit lines, and a voltage regulator. The voltage regulator is configured to generate a gate voltage on the gates of the bit line selector transistors that is less than the unselect voltage and that causes the bit line selector transistors receiving the select voltage from a bit line to conduct.

In another implementation, a select voltage, an unselect voltage, and a bit line select voltage are generated. An operational variance associated with the generating of the unselect voltage is determined, and a bit line select voltage having a magnitude based on the operational variance is generated. The magnitude of the bit line select voltage is less than the unselect voltage so that the application of the bit line select voltage to an input of a bit line selector receiving the select voltage causes the bit line selector to conduct, and the application of the bit line select voltage to an input of a bit line selector receiving the unselect voltage biases the bit line selector off.

In another implementation, a memory device includes a plurality of bit lines and a plurality of column selectors connected to the bit lines. The column selectors are configured to output a select voltage or an unselect voltage to the bit lines. The memory device also includes a plurality of bit line selector transistors connected to the bit lines, a reference column selector, and a bias circuit. The reference column selector is connected to a precharge voltage. The bias circuit is connected to the reference column selector and configured bias the output of the reference column selector at a magnitude that is less than the unselect voltage so that application of the output of the column selector to the gate of a bit line transistor receiving the select voltage causes the bit line transistor to conduct.

Implementation may include one or more of the following features and/or advantages. For example, in one implementation, the operational variance can be based on a leakage current of a selector device. In another implementation, the voltage regulator may generate the gate voltage based on a leakage current. In another implementation, the voltage regulator can include a reference column selector that is utilized to determine an operational variance and thus the voltage regulator is less susceptible to process variations and temperature variations. These features and advantages may be separately realized by one or more of the implementations described below.

DETAILED DESCRIPTION

Figure 1:
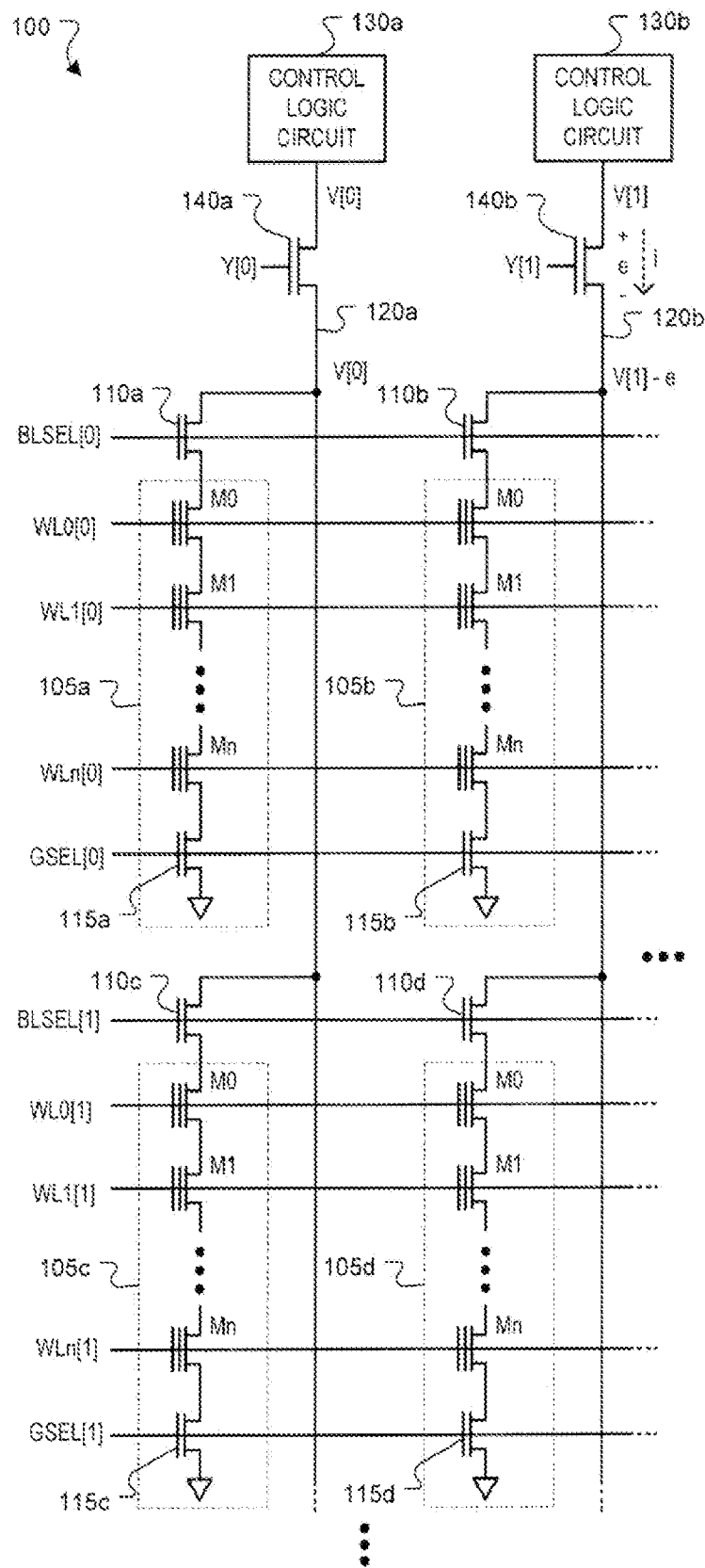
FIG. 1 is a circuit diagram of an example memory array.

Throughout the drawings, the same or similar reference numerals are applied to the same or similar parts and elements, and thus the description of the same or similar parts and elements will be omitted or simplified when possible.

FIG. 1 is a circuit diagram of an example memory array 100. The example memory array 100 is constructed accordingly to a matrix architecture, and thus for simplicity the circuit diagram of FIG. 1 illustrates only a subject of the example memory array 100.

The example memory array 100 can include memory strings 105, of which four memory strings 105a, 105b, 105c and 105d are shown. Each of the memory strings 105a-d includes corresponding memory locations, M0, M1 ... Mn. Each memory location can, for example, correspond to a storage location in the memory array 100, e.g., a bit. The memory locations M0-Mn of parallel memory strings 105a and 105b can be grouped in a row-like fashion by connecting the respective gates of the memory locations M0-Mn to corresponding word lines WL0[0]-WLn[0]. Likewise, the memory locations M0-Mn of the memory strings 105c and 105d can be grouped in a row-like fashion by connecting the respective gates of the memory locations M0-Mn to a group of corresponding word lines WL0[1]-WLn[1]. In one implementation, the memory locations M0-Mn are floating gate MOSFET transistors.

Each of the memory strings 105a-d includes, for example, a lower most location, e.g., M0, connected to a bit line selector (BLSEL) 110a, 110b, 110c and 110d, respectively, and an uppermost memory location, e.g., Mn, coupled to corresponding ground selectors 115a, 115b, 115c and 115d respectively. The bit line selectors 110a and 110c are, in turn, connected to a bit line 120a, and the bit line selectors 110b and 110d are, in turn, connected to another bit line 120b. The bit lines 120a and 120b are connected to corresponding control logic circuitry 130a and 130b though respective column selectors 140a and 140b.

The control logic circuits 130a and 130b and the respective column selectors 140a and 140b are utilized to select a reference voltage V[0] and a supply voltage V[1]. In one implementation, V[0] is a ground, e.g., $V_{ss}$, and V[1] is a supply voltage, e.g., $V_{dd}$. In some implementations, the control logic circuits 130a and 130b and the column selectors 140a and 140b can be column decoders that include one or more levels of decoding logic.

In one implementation, the column selectors 140a and 140b can be selectors having a high voltage rating, as the bit lines 120a and 120b experience a high potential during an erase operation. The column selectors 140a and 140b thus protect more sensitive circuitry coupled to the bit lines 120a and 120b, such as the control logic circuits 130a and 130b. In other implementations, the column selectors 140a and 140b can comprise circuitry in addition to the example transistors shown. For example, the column selectors can comprises multiple discrete components, and are thus represented in abstract form as transistors 140a and 140b.

In one implementation, a selected memory location is programmed during a program phase. To program a selected memory location in the memory array 100, a gate voltage is applied to the conductors BLSEL[0] or BLSEL[1], which are coupled to the bit line selectors 110a-d. A reference potential, e.g., ground, is applied as a select voltage to a bit line that is connected to the bit line selector coupled to the memory string in which the selected memory location is located. A programming pulse is applied on a word line that is connected to the gate of the selected memory location, while the source and drain of the selected memory location are maintained at the reference voltage. For example, to program the memory location M0 in the memory string 105a, a gate voltage is applied to the BLSEL[0] line, and a reference voltage V[0] is generated at the output of the control logic circuitry 130a and applied to the bit line 120a through the column selector 140a. Accordingly, the bit line selector 110a is forward biased and turns on. A word line select voltage, e.g., VsWL, is applied to the selected word line WL0[0], and a word line unselect voltage, e.g., VuWL, is applied to the unselected word lines WL1[0]-WLn[0]. The source and drain of the selected memory location, e.g., M0, are thus kept at a reference voltage V[0], e.g., a ground voltage. The program signals VsWL and VuWL rise to the magnitudes of VPGM and VPASS, respectively, and are maintained for a time period that ensures that the memory location M0 is programmed.

In one implementation, the memory locations in other memory strings 105 connected to the bit line 120a, e.g., memory string 105c, are left unselected by applying a reference voltage, e.g., a ground voltage or 0V, to the word lines and the BLSEL[1] line.

Because the word lines WL0[0]-WLn[0] are also connected to the corresponding gates of memory locations M0-Mn in parallel memory strings, e.g., memory string 105b, the memory locations M0-Mn in the parallel memory strings will also be coupled to the program signals VsWL and VuWL. To prevent programming of a memory location, e.g., M0, in a parallel memory string, e.g., memory string 105b, the corresponding bit line selector 110b is kept off by applying an unselect voltage to the bit 120b through the column selector 140b. In one implementation, the unselect voltage is based on the supply voltage V[1]. Thus, in the case of the BLSEL[0] line voltage being set to V[1], the channel of the unselected memory string 105b thus charges to a voltage of approximately V[1]-$V_{th}$, where $V_{th}$ is the threshold voltage of the bit line selector 110b. Thereafter, the bit line selector 110b remains off and the memory string 105b floats in response the capacitive coupling of the world line voltages WL0-WLn, thereby inhibiting programming of the respective memory locations M0-Mn.

In one implementation, to increase channel boosting efficiency, the programming of the memory locations is preceded by a precharge phase. During the precharge phase, a precharge gate voltage is applied to the gates of the bit line selectors 110a and 110b. The precharge gate voltage can be a voltage of greater magnitude than the supply voltage V[1]. For example, for a supply voltage V[1] of 3 V, a precharge voltage of 5 V can be used. Once the precharge phase has ended, the gates of the bit line selectors 110a and 110b are lowed in the supply voltage V[1].

If, however, there is a voltage drop across a column selector, either during the precharge phase or during the program phase, or if the control logic circuitry generates an unselect voltage that is slightly low, then the bit line selector may be slightly forward biased and conduct. Such conduction can reduce the channel boosting effect and cause inadvertent programming of other memory cells. For example, if the column selector 140b has a leakage current i, resulting in an operational variance of e, then the column selector 140b generates an unselect voltage of approximately V[1]−e. As the gate voltage on the bit line selector 110b is V[1], the bit line selector 110b is forward biased at the operational variance of +e, which can compromise channel boosting. By way of a further example, a memory string 105 can have a capacitance of about 1 fF, and thus a current of approximately 1 nA though the bit line selector 110 can discharge a memory string 105 by approximately 10 V during the program pulse duration.

Figure 2:
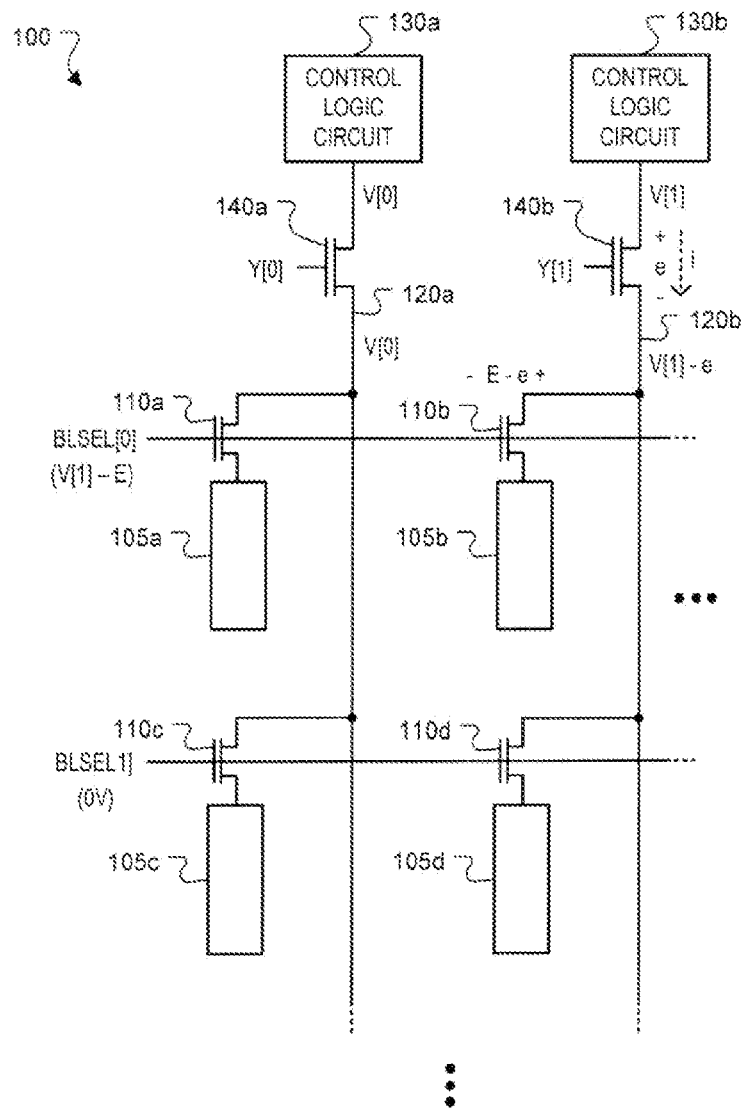
FIG. 2 is a block diagram of the circuit of FIG. 1 receiving an adaptive gate voltage as an input.

To minimize such deleterious effects on channel boosting, an adaptive gate voltage having a magnitude less than the generated unselect voltage V[1]−e is applied to the bit line selectors 110. FIG. 2 is a block diagram of the circuit of FIG. 1 receiving an example adaptive gate voltage having a magnitude of V[1]−E as an input. In an implementation, [E]>[e] such that a bit line selector 110 receiving the select voltage V[0], e.g. bit line selector 110a, will conduct while a bit line selector 110 receiving the unselect voltage V[1]−e, e.g. bit line selector 110b, will be turned off.

The application of the adaptive gate voltage to the gate of a bit line selector receiving the select voltage from a bit line causes the bit line selector to conduct. Conversely, the application of the adaptive gate voltage to the gate of a bit line selector receiving the unselect voltage biases bit line selector off. For example, in one implementation the bit line selectors 110 are MOSFET transistors. When the gate to source voltage of a bit line selector is substantially forward biased, e.g. V[1]−E−V[0], the bit line selector may conduct in a saturation condition and the memory string connected to the bit line selector will be at a voltage substantially equal to the select voltage on bit line, e.g., V[0]. When the gate to source voltage of a bit line selector is substantially zero or negative, e.g., V[1]−E−V[1]+e, or e−E, the bit line selector will be turned off and a memory string connected to the bit line selector will be at a floating voltage.

Figure 3:
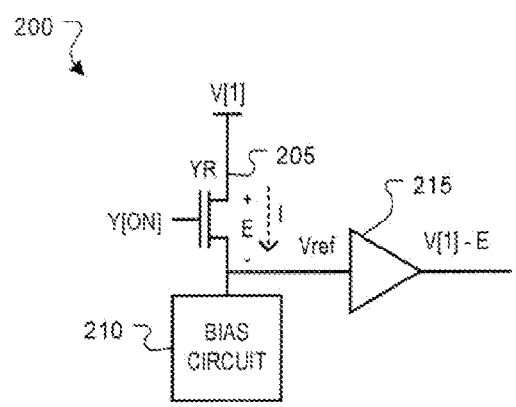
FIG. 3 is a block diagram of an example voltage regulator to generate the adaptive gate voltage.

FIG. 3 is a block diagram of an example voltage regulator 200 for generating an adaptive gate voltage V[1]−E. In some implementations, the voltage regulator 200 may generate the regulated output voltage V[1]−E such that V[0]<V[1]−E<V[1]−e. In one implementation, the bit line selectors are MOSFET transistors, and the magnitude of E is selected to ensure that the bit line selectors coupled to bit lines having a select voltage V[0] will conduct in at least the triode or saturation region, and that the bit line selectors coupled to the bit lines at the unselect voltage V[1]−e will be reverse biased.

The voltage regulator 200 includes a reference column selector 205 and a bias circuit 210 configured to generate a voltage reference $V_{ref}$. In some implementations, the reference column selector 205 can be a matched transistor of a column selector, such as column selector 140a or 140b. For example, the reference column selector 205 may be a transistor with substantially identical operation characteristics as the column selector transistors 140a and 140b, and may receive a gate input voltage Y[ON] of 5 V.

A bias circuit 210 is connected to the reference column selector 205. In some implementations, the bias circuit 210 is configured to generate a bias signal based on a leakage current of the column selectors when a bit line that is connected to the column selector is selected. The output of the column selector 205 is buffered by a buffer circuit 215 and output as the adaptive gate voltage V[1]−E, where E is the voltage margin such that |E|>|e|.

In one implementation, the matching of the reference column selector 205 to a column selector can substantially reproduce a leakage current experienced in the column selectors 140. In one implementation, to provide the voltage margin E, the bias circuit 210 can produce a signal that causes the reference column selector 205 to have a bias current that maintains the reference column selector 205 in the subthreshold region near the conductive region. In another implementation, to provide the voltage margin E, the bias circuit 210 can produce a signal that causes the reference column selector 205 to have a gate-to-source voltage slightly below the nominal threshold value $V_T$. In these example implementations, a current I flowing through the reference column selector 205 exceeds the leakage current i in the column selectors. Accordingly, the adaptive gate voltage of V[1]−E is generated, where |E|>|e|. Thus, gate select voltage V[1]−E can be based on and compensate for the operational variance associated with generating the unselect voltage V[1]−e.

Figure 4:
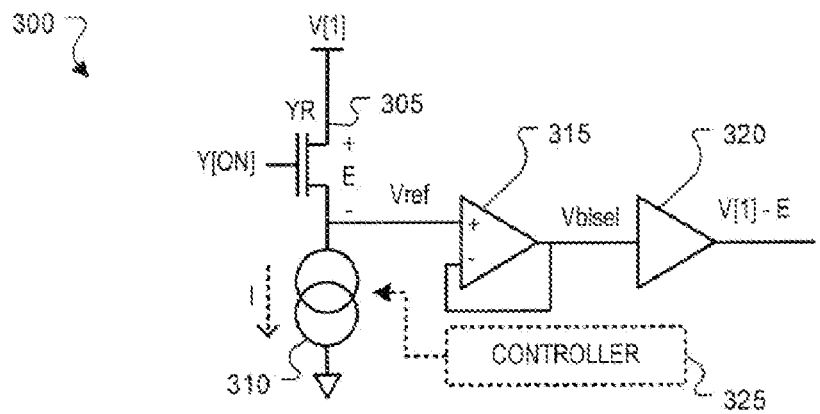
FIG. 4 is a block diagram of another example voltage regulator to generate the adaptive gate voltage.

FIG. 4 is a block diagram of another example voltage regulator 300 configured to generate the adaptive gate voltage V[1]−E. The voltage regulator 300 includes a reference column selector 305 and a current source 310 configured to generate a voltage reference $V_{ref}$. The reference voltage $V_{ref}$ can be amplified by an amplifier 315 to generate a bit line select voltage Vblsel. In on implementation, the amplifier 315 is a unity gain amplifier. The bit line select voltage Vblsel can be buffered by a buffer amplifier 310 to generate the adaptive gate voltage V[1]−E.

In some implementations, the reference column selector 305 can be a matched transistor of a column selector, such as column selector 140a or 140b. The current source 310 can, for example, generate the bias current I selected to maintain conduction in the reference column selector 305 in the subthreshold region near the conductive region. The bias current I can be greater than the leakage current i in the column selectors 140a and 140b to regulate the V[1]−E to be lower than V[1]−e. In some examples, a voltage margin between V[1]−E and V[1]−e may be directly related to the difference between the bias current I and the leakage current i.

In some implementations, the current source 310 can also include control input that allows the bias current I to be adjusted. For example, a controller or a processor 325 can transmit a control signal to the current source 310 to adjust the bias current I to vary the voltage margin E−e between the applied gate voltage and the select voltage in the bit lines 120a, 120b. The control signal can, for example, be based on an error rate, or some of the data indicative of inadvertent channel discharge.

Figure 5:
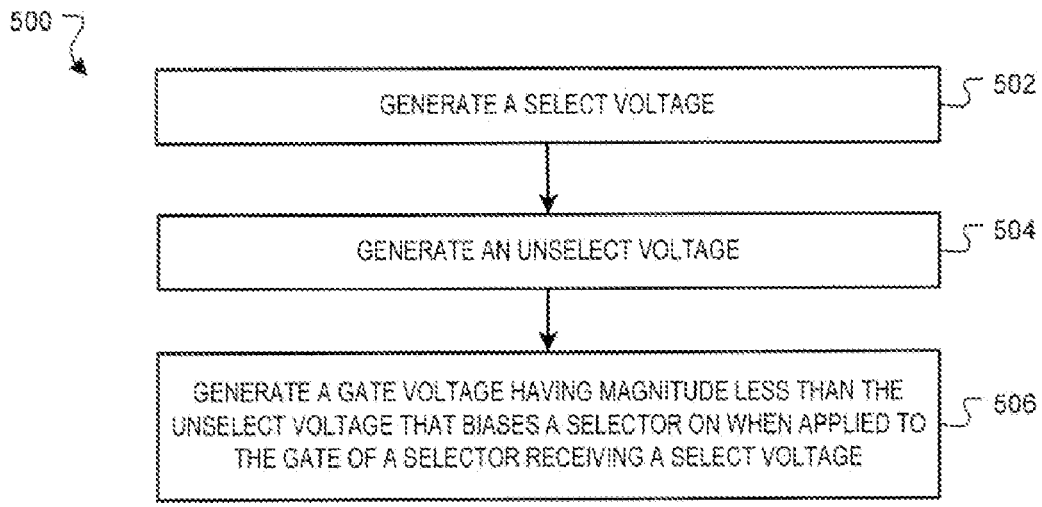
FIG. 5 is a flow diagram of an example process for programming a memory device.

FIG. 5 is a flow diagram of an example process 500 for programming a memory device. Using the process 500, the discharge of unselected boosted channels through a bit line selector may be prevented by adaptively generating a gate voltage for the bit line selectors.

Stage 502 generates a select voltage. For example, the control logic circuitry 130a of FIG. 1 generates a voltage V[0], which is coupled to the bit line 120a through the column selector transistor 140a. A resulting select voltage V[0] is generated.

Stage 504 generates an unselect voltage. For example, the control logic circuitry 130b of FIG. 1 generates a voltage V[1], which is coupled to the bit line 120b trough the column selector 140b. A resulting unselect voltage V[1]−e is generated where the voltage e is due to an operational variance. In one implementation, the operational variance is a source-to-drain voltage drop e across the column selector 140b.

Stage 506 generates a gate voltage having magnitude less than the unselect voltage that biases a selector on when applied to the gate of a selector receiving a select voltage. For example, the voltage regulator 200 of FIG. 3 or 300 of FIG. 4 generates the adaptive gate voltage V[1]−E where |E|>|e|. The gate voltage biases a bit line selector 110 on when the bit line selector 110 is receiving a select voltage V[0].

Figure 6:
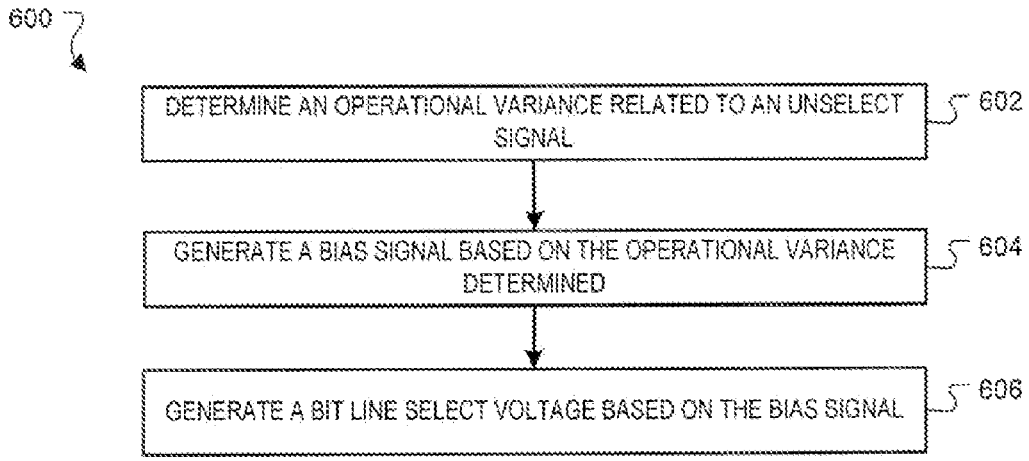
FIG. 6 is a flow diagram of an example process for generating an adaptive gate voltage.

FIG. 6 is a flow diagram of an example process 600 for generating an adaptive gate voltage. In some examples, the voltage regulator 200 of FIG. 3 or 300 of FIG. 4 may use the process 600 to generate the gate voltage V[1]−E.

Stage 602 determines an operational variance related to an unselect signal. In one implementation, the operational variance can be based on a leakage current. For example, the leakage current associated with a column selector can be determined based on measurements or based on simulations. In another implementation, the operational variance can be based on a voltage differential. For example, the voltage drop associated with a column selector can be determined based on measurements or based on simulations.

Stage 604 generates a bit line select voltage based on the bias signal. For example, the bias circuit 210 of FIG. 3 can generate the bias signal based on the leakage current determined in stage 602. In another example, the current source 305 can generate the bias current I based on the determined leakage current i, i.e., |I|>|i|.

Stage 605 generates a bit line select voltage based on the bias signal. For example, $V_{ref}$ value may be buffered to generate the gate voltage V[1]−E.

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

What is claimed is:

1. A memory device, comprising:
   a plurality of bit lines;
   a plurality of column selectors connected to the bit lines and configured to receive a first voltage or a second voltage and output a select voltage or an unselect voltage to the bit lines;
   a plurality of bit line selector transistors connected to the bit line, each bit line selector transistor defining a gate; and
   a voltage regulator configured to generate a gate voltage on the gates of the bit line selector transistors that is less than the unselect voltage and that causes the bit line selector transistors receiving the select voltage from a bit line to conduct.

2. The memory device of claim 1, wherein:
   the first voltage is a ground voltage;
   the second voltage is a power supply voltage; and
   the unselect voltage is equal to the power supply voltage minus a column selector voltage.

3. The memory device of claim 2, wherein:
   the column selector voltage comprises a leakage current voltage drop.

4. The memory device of claim 1, wherein:
   the voltage regulator comprises:
      a reference column selector configured to receive the second voltage; and
      a bias circuit connected to the reference column selector and configured to generate a bias signal based on a leakage current of a column selector outputting the unselect voltage to a bit line.

5. The memory device of claim 4, wherein:
   the column selectors and reference column selectors are transistors and wherein the bias circuit is configured to bias the reference column selector in a sub-threshold region.

6. The memory device of claim 5, wherein:
   the bias circuit comprise a current source.

7. The memory device of claim 4, further comprising:
   a buffer amplifier connected to an output of the reference column selector and configured to generate the gate voltage based on the output of the reference column selector.

8. The memory device of claim 1, further comprising:
   a plurality of memory strings connected to the plurality of bit line selector transistors, each memory string defined by a plurality of memory cells.

9. The memory device of claim 8, wherein:
   the memory device comprises a flash memory device.

10. The memory device of claim 9, wherein:
    the flash memory device comprises a NAND flash array.

11. The memory device of claim 1, wherein:
    the gate voltage causes the bit line selector transistors receiving the select voltage from a bit line to conduct in a saturation condition.

12. A method, comprising:
    generating a select voltage;
    generating an unselect voltage;
    determining an operational variance associated with generating the unselect voltage; and
    generating a bit line select voltage having a magnitude based on the operational variance, the magnitude less than the unselect voltage so that the application of the bit line select voltage to an input terminal of a bit line selector receiving the select voltage causes the bit line selector to conduct, and the application of the bit line select voltage to an input terminal of a bit line selector receiving the unselect voltage biases the bit line selector off.

13. The method of claim 12, wherein:
    determining a operational variance associated with generating the unselect voltage comprises:
       determining a leakage current generated during the generation of the unselect voltage.

14. The method of claim 13, wherein:
    generating a bit line select voltage comprises:
       generating a bias signal based on the leakage current determined; and
       generating the bit line select voltage based on the bias signal.

15. The method of claim 13, wherein:
    generating an unselect voltage comprises:
       applying a first voltage to an input of a column selector;
       applying a precharge voltage to a first terminal of the column selector; and
       outputting the unselect voltage at a second terminal of the column selector.

16. A memory device, comprising:
    a reference column selector configured to be connected to a precharge voltage;
    a bias circuit connected to the reference column selector and configured bias an output of the reference column selector at a magnitude that is less than an unselect voltage so that application of an output of a column selector to a gate of a bit line transistor receiving a select voltage causes the bit line transistor to conduct.

17. The memory device of claim 16, wherein:
    the select voltage is generated from a ground voltage;
    the unselect voltage is generated from a power supply voltage; and
    the unselect voltage is equal to the power supply voltage minus a column selector voltage.

18. The memory device of claim 16, wherein:
    the column selector voltage comprises a leakage current voltage drop.

19. The memory device of claim 16, wherein:
    the bias circuit generates the bias signal based on a leakage current of a column selector outputting an unselect voltage to a bit line.

20. The memory device of claim 16, wherein:
    the bias circuit comprise a current source.

21. The memory device of claim 16, further comprising:
    a plurality of memory strings connected to the plurality of bit line selector transistors, each memory string defined by a plurality of memory cells.

22. The memory device of claim 15, wherein:
    the memory device comprises a flash memory device.

23. A memory device, comprising:
    means for generating a select voltage and an unselect voltage; and
    means for generating a gate voltage that causes a bit line selector transistor receiving the gate voltage at a gate and receiving the select voltage at a source to saturate, and that causes a bit line selector transistor receiving the gate voltage at a gate and receiving the unselect voltage at a source to be biased off.

* * * * *

UNITED STATES PATENT AND TRADEMARK OFFICE
CERTIFICATE OF CORRECTION

PATENT NO. : 7,417,904 B2
APPLICATION NO. : 11/554797
DATED : August 26, 2008
INVENTOR(S) : Stefano Sivero et al.

It is certified that error appears in the above-identified patent and that said Letters Patent is hereby corrected as shown below:

In Column 7, Line 18, in Claim 1, after "bit" delete "line," and insert -- lines, --.

In Column 7, Line 24, in Claim 1, delete "conduct." and insert -- conduct; wherein the first voltage is a ground voltage, the second voltage is a supply voltage, and the unselected voltage is equal to the power supply voltage minus a column selector voltage. --.

In Column 7, Lines 25-29, Delete "2. The memory device of claim 1, wherein: the first voltage is a ground voltage; the second voltage is a power supply voltage; and the unselect voltage is equal to the power supply voltage minus a column selector voltage.".

In Column 7, Line 30, in Claim 3, delete "3. The memory device of claim 2, wherein:" and insert -- 2. The memory device of claim 1, wherein: --.

In Column 7, Lines 33-40, in Claim 4, delete "4. The memory device of claim 1, wherein: the voltage regulator comprises: a reference column selector configured to receive the second voltage; and a bias circuit connected to the reference column selector and configured to generate a bias signal based on a leakage current of a column selector outputting the unselect voltage to a bit line."; and insert -- 3. A memory device, comprising: a plurality of bit lines; a plurality of column selectors connected to the bit lines and configured to receive a first voltage or a second voltage and output a select voltage or unselect voltage to the bit lines; a plurality of bit line selector transistors connected to the bit lines, each bit selector transistor defining a gate; and a voltage regulator configured to generate a gate voltage on the gates of the bit line selector transistors that is less than the unselect voltage and that causes the bit line selector transistors receiving the select voltage from a bit line to conduct; wherein the voltage regulator comprises: a reference column selector configured to receive the second voltage; and a bias circuit connected to the reference column selector and configured to generate a bias signal based on a leakage current of a column selector outputting the unselect voltage to the bit line. --.

In Column 7, Line 41, in Claim 5, delete "5. The memory device of claim 4, wherein:" and insert -- 4. The memory device of claim 3, wherein: --.

In Column 7, Line 43, in Claim 5, after "transistors" insert -- , --.

In Column 7, Line 46, in Claim 6, delete "6. The memory device of claim 5, wherein:" and insert -- 5. The memory device of claim 4, wherein: --.

UNITED STATES PATENT AND TRADEMARK OFFICE
CERTIFICATE OF CORRECTION

PATENT NO. : 7,417,904 B2
APPLICATION NO. : 11/554797
DATED : August 26, 2008
INVENTOR(S) : Stefano Sivero et al.

It is certified that error appears in the above-identified patent and that said Letters Patent is hereby corrected as shown below:

In Column 7, Line 48, in Claim 7, delete "7. The memory device of claim 4, further comprising." and insert -- 6. The memory device of claim 3, further comprising: --.

In Column 7, Line 53, in Claim 8, delete "8. The memory device of claim 1, further comprising:" and insert -- 7. The memory device of claim 1, further comprising: --.

In Column 7, Line 57, in Claim 9, delete "9. The memory device of claim 8, wherein:" and insert -- 8. The memory device of claim 7, wherein, --.

In Column 7, Line 59, in Claim 10, delete "10. The memory device of claim 9, wherein:" and insert -- 9. The memory device of claim 8, wherein, --.

In Column 7, Line 61, in Claim 11, delete "11. The memory device of claim 1, wherein:" and insert -- 10. The memory device of claim 1, wherein, --.

In Column 7, Line 65, in Claim 12, delete "12. A method, comprising:" and insert --11. A method, comprising:" --.

In Column 8, Line 10, in Claim 13, delete "13. The method of claim 12, wherein:" and insert -- 12. The method of claim 11, wherein: --.

In Column 8, Line 15, in Claim 14, delete "14. The method of claim 13, wherein:" and insert -- 13. The method of claim 12, wherein: --.

In Column 8, Line 21, in Claim 15, delete "15. The method of claim 13, wherein:" and insert -- 14. The method of claim 12, wherein: --.

In Column 8, Line 28, in Claim 16, delete "16. A memory device, comprising." and insert -- 15. A memory device, comprising: --.

In Column 8, Line 37, in Claim 17, delete "17. The memory device of claim 16, wherein:" and insert -- 16. The memory device of claim 15, wherein: --.

In Column 8, Line 43, in Claim 18, delete "18. The memory device of claim 16, wherein:" and insert -- 17. The memory device of claim 15, wherein: --.

In Column 8, Line 46, in Claim 19, delete "19. The memory device of claim 16, wherein:" and insert -- 18. The memory device of claim 15, wherein: --.

UNITED STATES PATENT AND TRADEMARK OFFICE
CERTIFICATE OF CORRECTION

PATENT NO. : 7,417,904 B2
APPLICATION NO. : 11/554797
DATED : August 26, 2008
INVENTOR(S) : Stefano Sivero et al.

It is certified that error appears in the above-identified patent and that said Letters Patent is hereby corrected as shown below:

In Column 8, Line 50, in Claim 20, delete "20. The memory device of claim 16, wherein:" and insert -- 19. The memory device of claim 15, wherein: --.

In Column 8, Line 52, in Claim 21, delete "21. The memory device of claim 16, further comprising:" and insert -- 20. The memory device of claim 15, further comprising: --.

In Column 8, Line 56, in Claim 22, delete "22. The memory device of claim 15, wherein:" and insert -- 21. The memory device of claim 15, wherein: --.

In Column 8, Line 58, in Claim 23 delete "23. A memory device, comprising" and insert -- 22. A memory device, comprising: --.

Signed and Sealed this

Twenty-fourth Day of February, 2009

JOHN DOLL
*Acting Director of the United States Patent and Trademark Office*